(12) United States Patent
Watanabe et al.

(10) Patent No.: US 7,964,486 B2
(45) Date of Patent: Jun. 21, 2011

(54) FIELD EFFECT TRANSISTOR AND METHOD FOR FABRICATING THE SAME

(75) Inventors: Tadashi Watanabe, Yamanashi (JP); Hajime Matsuda, Yamanashi (JP)

(73) Assignee: Eudyna Devices Inc., Yamanashi (JP)

( * ) Notice: Subject to any disclaimer, the term of this patent is extended or adjusted under 35 U.S.C. 154(b) by 562 days.

(21) Appl. No.: 12/027,425

(22) Filed: Feb. 7, 2008

(65) Prior Publication Data
US 2008/0211052 A1 Sep. 4, 2008

(30) Foreign Application Priority Data

Feb. 7, 2007 (JP) ................................ 2007-028603

(51) Int. Cl.
*H01L 21/28* (2006.01)
(52) U.S. Cl. ................. 438/574; 438/579; 257/E21.064
(58) Field of Classification Search ............... 438/574, 438/576, 579, 578, 582, 583; 257/281, 282, 257/283, 284
See application file for complete search history.

(56) References Cited

U.S. PATENT DOCUMENTS

| 5,496,748 A | | 3/1996 | Hattori et al. |
| 5,693,560 A | * | 12/1997 | Hattori et al. .................. 257/473 |
| 6,114,241 A | * | 9/2000 | Choi et al. ..................... 438/677 |

FOREIGN PATENT DOCUMENTS

| JP | 4-246836 A | 9/1992 |
| JP | 6-163605 A | 6/1994 |
| JP | 7-86310 A | 3/1995 |

OTHER PUBLICATIONS

Japanese Office Action dated Feb. 24, 2009, issued in corresponding Japanese Patent Application No. 2007-028603.

* cited by examiner

*Primary Examiner* — Charles D Garber
*Assistant Examiner* — Reema Patel
(74) *Attorney, Agent, or Firm* — Westerman, Hattori, Daniels & Adrian, LLP (57) ABSTRACT

A method for fabricating a field effect transistor includes: forming an insulating film provided on a semiconductor layer, the insulating film having an opening via which a surface of the semiconductor layer is exposed and including silicon oxide; forming a Schottky electrode on the insulating film and in the opening, the Schottky electrode having an overhang portion and having a first contact layer that is provided in a region contacting the insulating film and contains oxygen, and a second contact layer that is provided on the first contact layer and contains a smaller content of oxygen than that of the first contact layer; and removing the insulating film by a solution including hydrofluoric acid.

8 Claims, 11 Drawing Sheets

FIELD EFFECT TRANSISTOR AND METHOD FOR FABRICATING THE SAME

BACKGROUND OF THE INVENTION

1. Field of the Invention

The present invention generally relates to a field effect transistor and a method for fabricating the same, and more particularly, to a field effect transistor having tungsten silicide as a connecting layer connected to a semiconductor layer and a method for fabricating the same.

2. Description of the Related Art

Figure 1A:
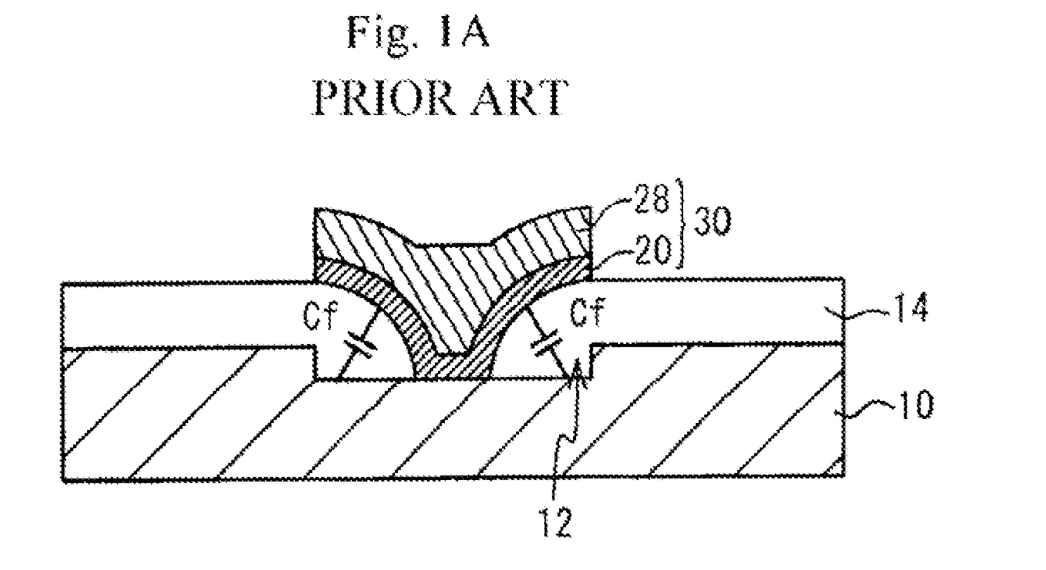
FIGS. 1A and 1B are cross-sectional views of a conventional FET.
Figure 1B:
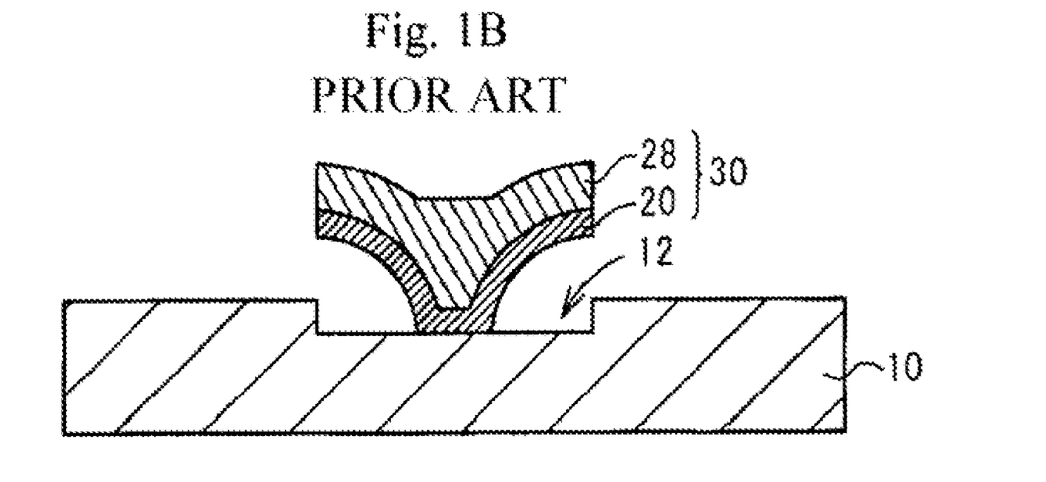

There is an FET (Field Effect Transistor) having a Schottky electrode that contacts a semiconductor substrate. An example of this type is MESFET (Metal Semiconductor Field Effect Transistor). FIGS. 1A and 1B are respectively cross-sectional views of a conventional FET having a Schottky electrode that contacts a semiconductor substrate 10 containing GaAs (gallium arsenide). This type of FET is described in, for example, Japanese Patent Application Publication No. 6-163605. Referring to FIG. 1A, a recess 12 is formed on the semiconductor substrate 10. A silicon oxide ($SiO_2$) film 14 having an opening is formed on the semiconductor substrate 10. A Schottky electrode 30 is formed in the opening. The Schottky electrode 30 is composed of a contact layer 20 made of tungsten silicide (WSi), and a metal layer 28 made of gold (Au). The Schottky electrode 30 contacts the semiconductor substrate 10 in the recess 12, and functions as a gate electrode of the FET. There is a parasitic capacitance Cf resulting from a dielectric film, which is the silicon oxide film 14 between the semiconductor substrate 10 and the Schottky electrode 30. Thus, as shown in FIG. 1B, the silicon oxide film 14 is removed to reduce the parasitic capacitance Cf between the semiconductor substrate 10 and the Schottky electrode 30.

However, there is a problem that contact layer 20 of tungsten silicide is chipped when the silicon oxide film 14 is removed by a solution containing hydrofluoric acid. The contact layer 20 thus chipped degrades the reliability of the Schottky electrode and deteriorates the performance of FET.

SUMMARY OF THE INVENTION

The present invention has been made in view of the above circumstances and provides a semiconductor device capable of restraining a contact layer from being chipped and a method for fabricating the same.

According to an aspect of the present invention, there is provided a method for fabricating a semiconductor device including: forming an insulating film provided on a semiconductor layer, the insulating film having an opening via which a surface of the semiconductor layer is exposed and including silicon oxide; forming a Schottky electrode on the insulating film and in the opening, the Schottky electrode having an overhang portion and having a first contact layer that is provided in a region contacting the insulating film and contains oxygen, and a second contact layer that is provided on the first contact layer and contains a smaller content of oxygen than that of the first contact layer; and removing the insulating film by a solution including hydrofluoric acid.

According to another aspect of the present invention, there is provided a semiconductor device including: a semiconductor layer; and a Schottky electrode provided on the semiconductor layer and composed of an overhang portion, the Schottky electrode having a contact layer that is provided in a region that contacts a surface of the semiconductor layer and is located below the overhang portion, the contact layer being made of tungsten silicide having an oxygen content of 2.6% or more.

According to yet another aspect of the present invention, there is provided a semiconductor device including: a semiconductor layer; and a Schottky electrode provided on the semiconductor layer and composed of an overhang portion, the Schottky electrode having a first contact layer that is located below the overhang portion and is made of tungsten silicide containing oxygen, and a second contact layer that is provided on the first contact layer and has a smaller oxygen content than that of the first contact layer.

According to a further aspect of the present invention, there is provided a method for fabricating a semiconductor device including: forming an insulating film provided on a semiconductor layer, the insulating film having an opening via which a surface of the semiconductor layer is exposed and including silicon oxide; forming a Schottky electrode on the insulating film and in the opening, the Schottky electrode having an overhang portion and having a contact layer that is provided in a region contacting the insulating film and is composed of a portion made of tungsten silicide having an oxygen content of 2.6% or more; and removing the insulating film by a solution including hydrofluoric acid.

DESCRIPTION OF THE PREFERRED EMBODIMENTS

A description will now be given of embodiments of the present invention with reference to the accompanying drawings.

First Embodiment

Figure 2A:
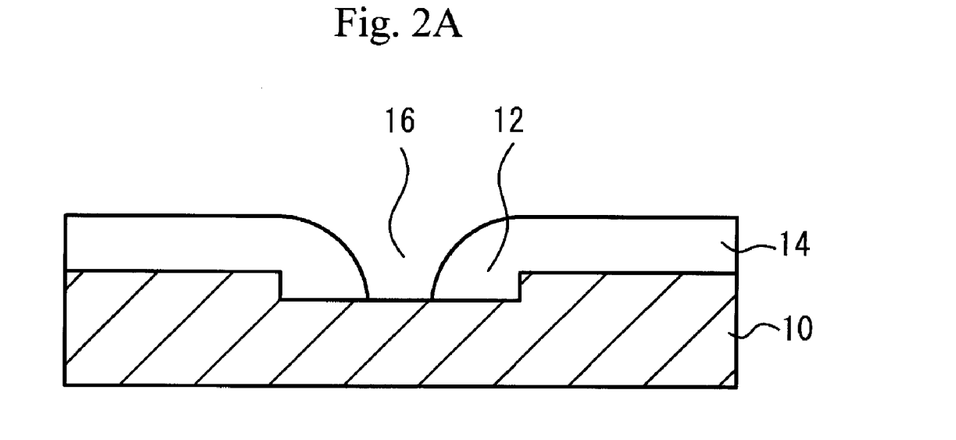
FIGS. 2A through 2C are cross-sectional views of steps of a process for fabricating an FET in accordance with a first embodiment.

A description will now be given, with reference to FIGS. 2A through 3B, of a method for fabricating an FET in accordance with a first embodiment of the present invention. Referring to FIG. 2A, the semiconductor substrate 10 (semiconductor layer) is formed by epitaxially growing a channel layer of InGaAs (indium gallium arsenide) and an electron supply layer of AlGaAs (aluminum gallium arsenide) on a GaAs substrate. The recess 12 is formed on the semiconductor substrate 10. The silicon oxide film 14 (insulating film) is formed on the semiconductor substrate 10 by CVD (Chemical Vapor Deposition). The opening 16 is formed in a recess portion of the silicon oxide film 14. This process defines the silicon oxide film 14 having the opening 16 through which the surface of the semiconductor substrate 10 is exposed. The silicon oxide film 14 has a thickness of approximately 300 nm, and the length of the opening 16 on the bottom of the silicon oxide film 14 that contacts the semiconductor substrate 10 is approximately 0.2 μm. The length of the opening 16 on the bottom of the silicon oxide film 14 is less than that of the opening on the top thereof. This is because the opening 16 is formed by a sidewall method.

Figure 2B:
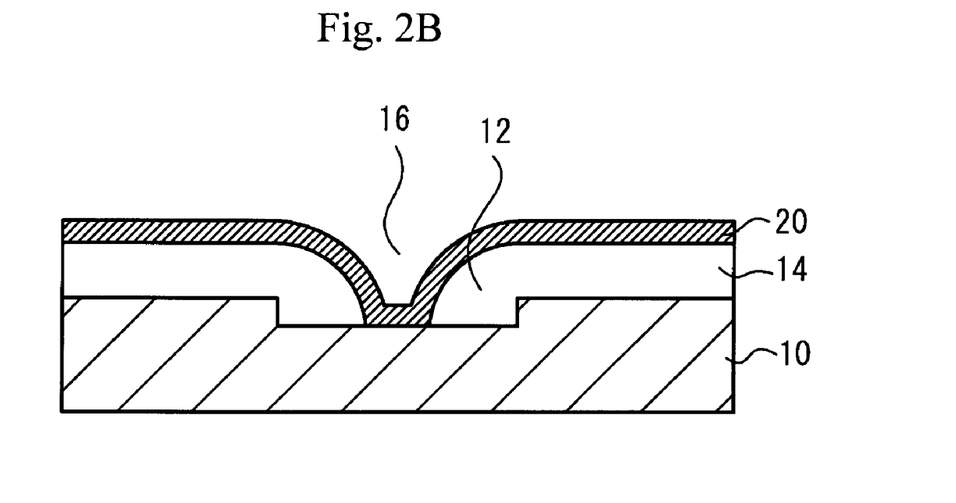

Referring to FIG. 2B, tungsten silicide is grown to a thickness of approximately 0.15 μm on the silicon oxide film 14 and in the opening 16 by DC sputtering, so that a contact layer 20 of tungsten silicide can be formed. The inventors investigated the quality of tungsten silicide grown as the contact layer 20 shown in FIG. 2B. The investigation used a sputtering power of 2 kW and sputtering gas of argon (Ar). The content of oxygen (mole %) and the content of argon were evaluated while the sputtering pressure that is the pressure of the sputtering gas in the sputtering apparatus was changed. Then, the semiconductor substrate 10 is annealed at 500° C. for 30 minutes.

Figure 2C:
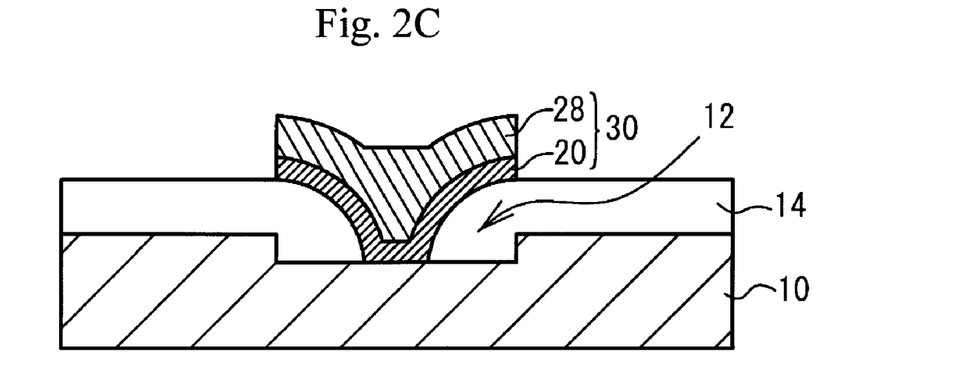

Referring to FIG. 2C, the metal layer 28 of Au is formed on the contact layer 20 by plating. The contact layer 20 is removed with the metal layer 28 being as a mask, so that the Schottky electrode 30 composed of the contact layer 20 and the metal layer 28 can be completed.

Figure 3A:
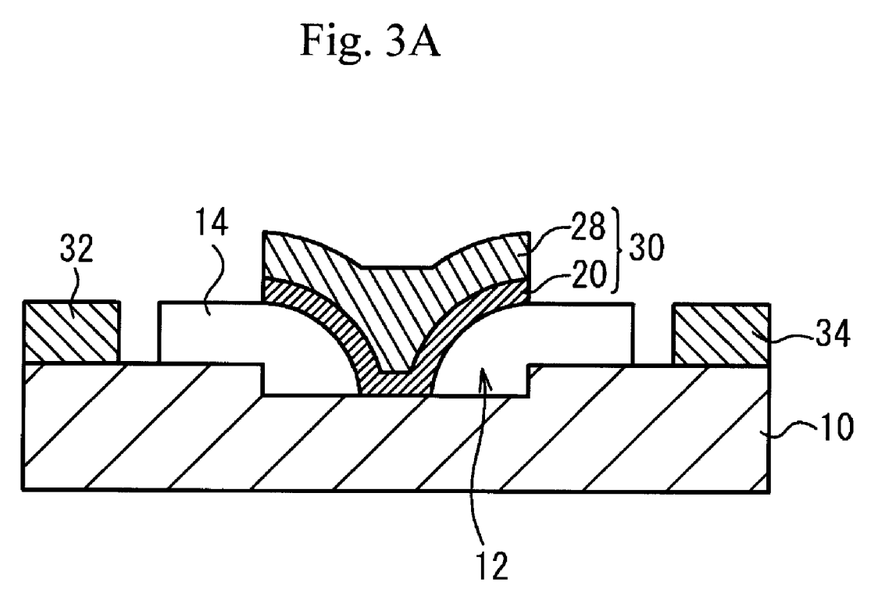
FIGS. 3A and 3B are cross-sectional views of steps of the process following the steps shown in FIGS. 2A through 2C.

Referring to FIG. 3A, the silicon oxide film 14 is removed from predetermined regions, and a source electrode 32 and a drain electrode 34, which are ohmic contacts, are formed by evaporation.

Figure 3B:
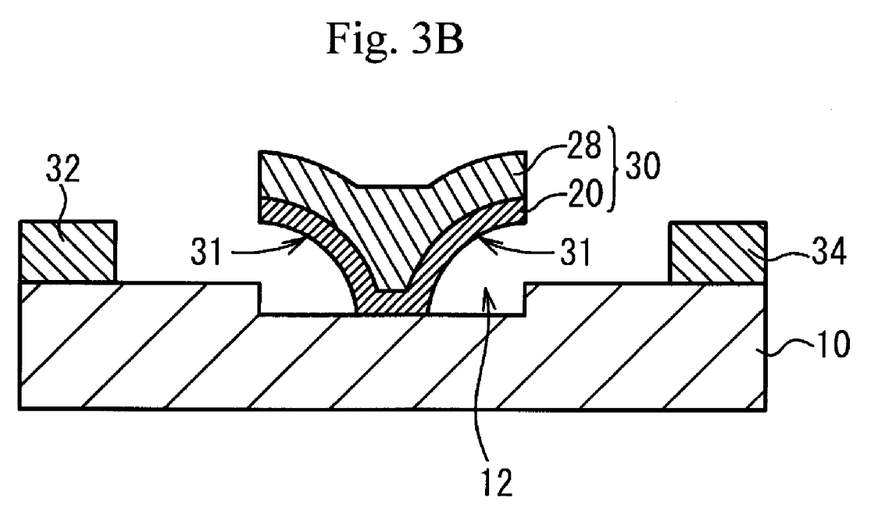

Referring to FIG. 3B, the silicon oxide film 14 is removed by an HF solution, which may be buffered hydrofluoric acid composed of hydrofluoric acid and ammonium fluoride. In this step, the silicon oxide film 14 located below an overhang portion 31 of the Schottky electrode 30 is completely removed. FIG. 3B shows the completed FET.

Figure 4:
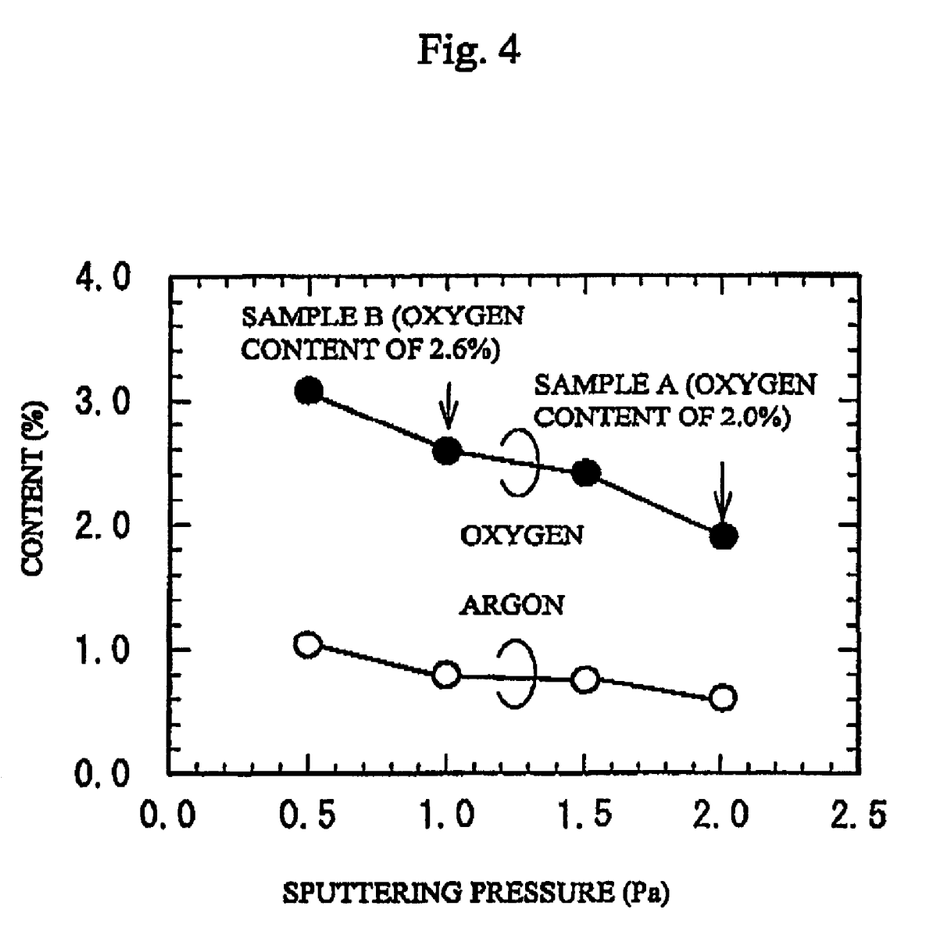
FIG. 4 shows an oxygen content and an argon content as a function of sputtering pressure in tungsten silicide.

FIG. 4 is a graph of the content of oxygen and the content of argon as a function of sputtering pressure. The contact layer 20 contains oxygen ($O_2$) along with argon (Ar) that is sputtering gas. This is because residual oxygen in a chamber of the sputtering apparatus is captured by tungsten silicide. As the sputtering pressure is decreased, the content of argon is increased and the content of oxygen is also increased.

Figure 5:
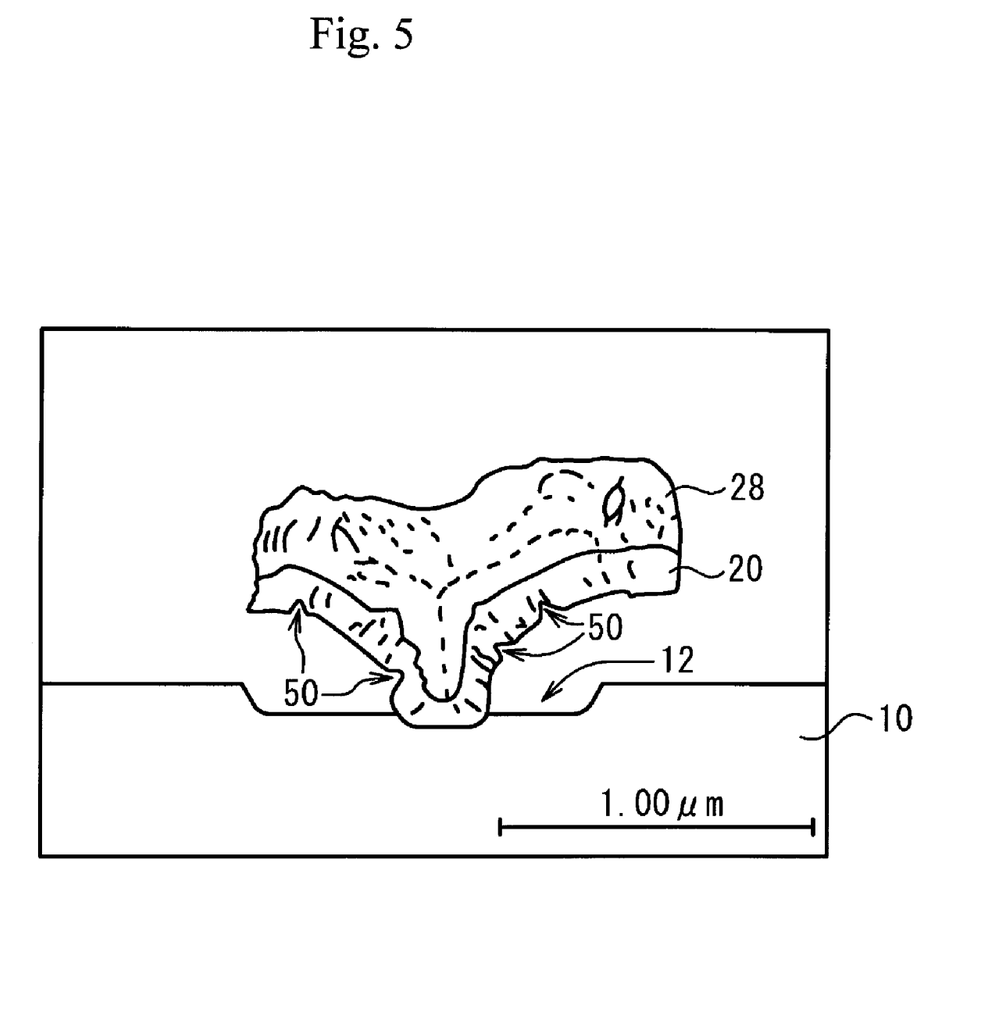
FIG. 5 is a schematic cross-sectional view of sample A.
Figure 6:
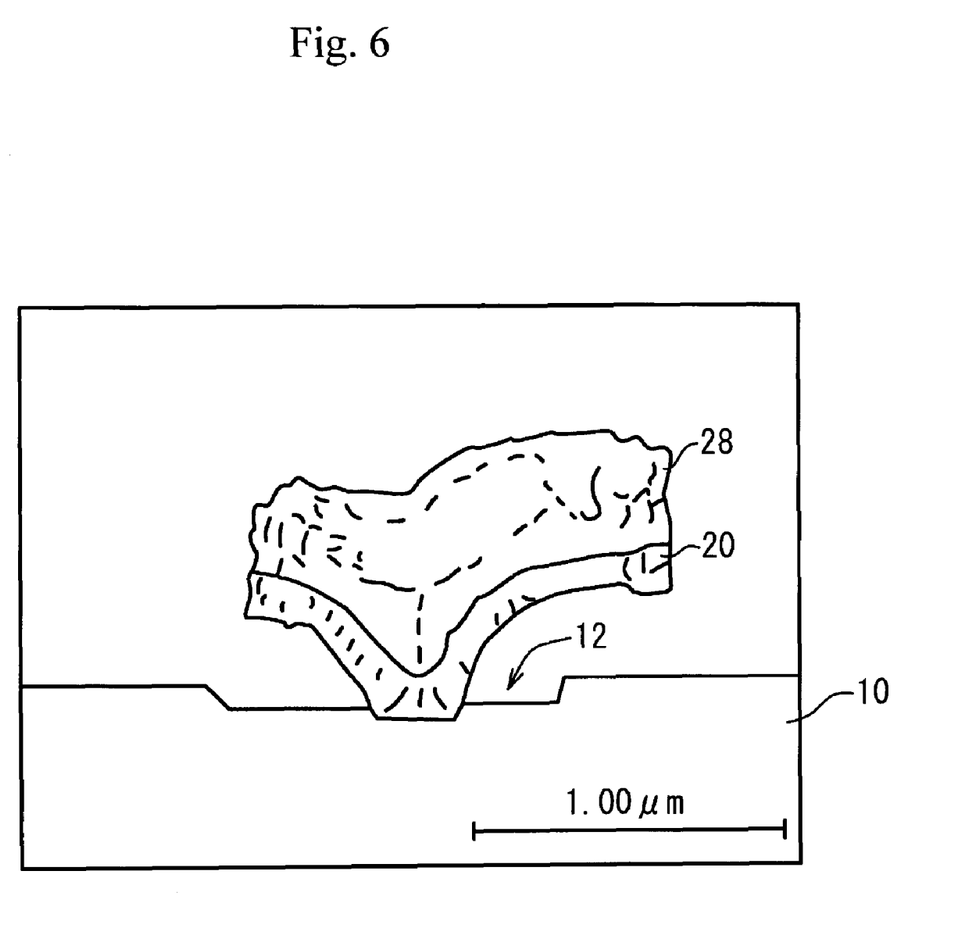
FIG. 6 is a schematic cross-sectional view of sample B.

FIGS. 5 and 6 are respectively schematic cross-sectional views of gate electrodes and their vicinities of samples A and B of FETs respectively having the contact layers 20 grown at sputtering pressures of 2.0 Pa and 1.0 Pa and respectively having oxygen contents of 2.0% and 2.6% (see FIG. 4). Referring to FIG. 5, chips 50 are observed in the contact layer 20 of tungsten silicide of sample A. In contrast, no chips are observed in the contact layer 20 of tungsten silicide of sample B. The chips 50 formed in the contact layer 20 of sample A degrade the reliability of the Schottky electrode 30 and deteriorate electrical performance. In contrast, sample B is highly reliable and is electrically stable in the absence of chips in the tungsten silicide contact layer 20.

As described above, an increased content of oxygen in tungsten silicide restrains chipping of tungsten silicide. This improvement may be explained as follows.

Etching of $SiO_2$ by HF is expressed by reaction formulas (1) and (2):

$$2HF + H_2O \rightarrow H_3O^+ + HF_2^- \quad (1)$$

$$SiO_2 + 2H_3O^+ + 2HF_2^- \rightarrow SiF_4 + 4H_2O \quad (2)$$

Formula (1) shows that the reaction does not progress in the absence of $H_2O$, and formula (2) shows that $H_2O$ is generated in the progress of the reaction.

If electrons $e^-$ are supplied to $H_2O$ in liquid phase due to a certain factor, $OH^-$ is generated by a reaction expressed by formula (3) by taking oxygen in the air:

$$O_2 + 2H_2O + 4e^- \rightarrow 4OH^- \quad (3)$$

It may be considered that a reaction described by formula (4) etches tungsten silicide from $OH^-$ generated by formula (3) and $HF_2^-$ generated by formula (1):

$$WSi + 4HF_2^- + 4OH^- \rightarrow WF_4 + SiF_4 + 4H_2O \quad (4)$$

In a case where the surface of the semiconductor substrate 10 is exposed to hydrofluoric acid, electrons in the conduction band are effused from the surface of the semiconductor substrate 10 into an aqueous solution, and the reaction described in formula (3) takes places. Thus, the reactions of formulas (2) and (4) may be caused. In order to investigate which one of the reactions of formulas (2) and (4) is faster than the other, sample C was prepared. Sample C was produced by growing the contact layer 20 under the same condition as that for sample A, and the silicon oxide film 14 was etched so as not to fully expose the overhang portion 31 of the Schottky electrode 30 in FIG. 3B.

Figure 7:
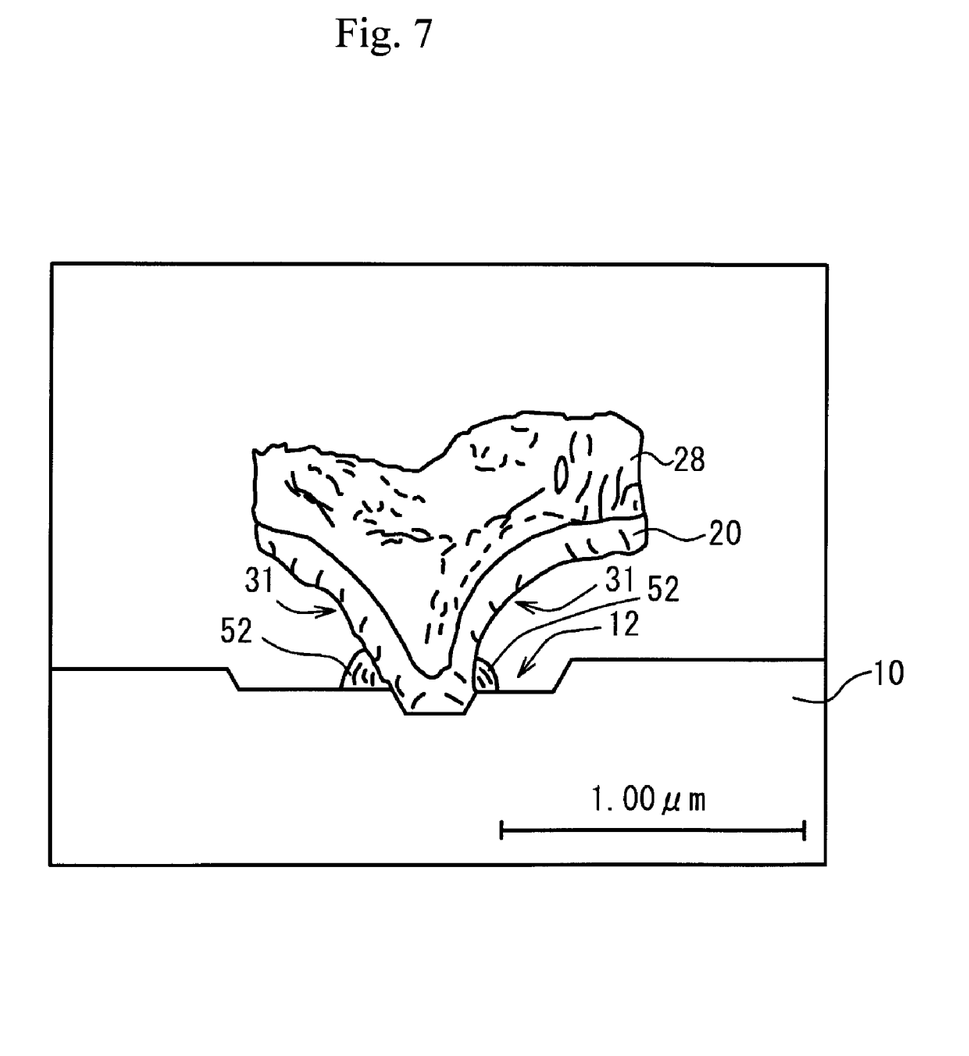
FIG. 7 is a schematic cross-sectional view of sample C.

FIG. 7 is a cross-sectional view of sample C. The silicon oxide film 14 remains below the overhang portion 31 of the contact layer 20 (indicated by reference numerals 52 in FIG. 7). In FIG. 7, chips in the tungsten silicide layer as shown in FIG. 5 are not observed. It may be considered from the above experimental results that $4HF_2^-$ generated in formula (1) is spent in the reaction of formula (2) during the time when $SiO_2$ remains, and the reaction of formula (4) does not take place so that tungsten silicide is not etched because the reaction of formula (2) is faster than that of formula (4).

Oxygen that is mixed with tungsten silicide when the contact layer 20 is formed shown in FIG. 2B, reacts with silicon of tungsten silicide by annealing and results in silicon oxide. Thus, the contact layer 20 of sample B contains silicon oxide in addition to tungsten silicide. It may be considered that, when there is a large amount of silicon oxide (that is, a large oxygen content), $4HF_2^-$ is used in the reaction with silicon oxide and tungsten silicide is not etched, as has been considered previously. It is however guessed that sample A does not have a sufficient amount of silicon oxide in tungsten silicide of the contact layer 20, which may cause the chips 50 in the contact layer 20 of tungsten silicide.

In terms of the above considerations, the contact layer 20 made of tungsten silicide having an oxygen content of 2.6% is formed in a region (a lower portion of the overhang portion 31) in which the contact layer 20 may contact the silicon oxide film 14. With this structure, the contact layer 20 of tungsten silicide is not chipped as shown in FIG. 6 even by removing the silicon oxide film 14 formed along the side surface of the opening 16 by a solution containing hydrofluoric acid. It is thus possible to improve the reliability of the Schottky electrode 30 and stabilize the electric performance. The contact layer 20 of tungsten silicide can be restrained from being chipped for an oxygen content of 2.6% or more. Only a part of a contact region over which the contact layer 20 of tungsten silicide contacts the silicon oxide film 14 may satisfy an oxygen content of 2.6% or more. Preferably, the entire contact region over which the contact layer 20 contacts the silicon oxide film 14 satisfies an oxygen content of 2.6% or more in order to more effectively restrain chipping of tungsten silicide. A portion of the contact layer 20 that contacts the semiconductor substrate 10 may have an oxygen content of 2.6% or more.

The first embodiment has the Schottky electrode 30 (contact layer 20) having the overhang portion 31, and the silicon oxide film 14 below the overhang portion 31 of the contact layer 20 is removed in FIG. 3B. The Schottky electrode 30 may have a rectangular shape. The Schottky electrode 30 having the overhang portion 31 has a large parasitic capacitance Cf between the Schottky electrode 30 and the semiconductor substrate 10 shown in FIG. 1A, as compared to the Schottky electrode formed into the rectangular shape. Thus, there is a strong demand to remove the silicon oxide film 14 that contacts the Schottky electrode 30. Thus, the contact layer 20 of tungsten silidie is liable to be chipped, and the structure of containing oxygen in tungsten silicide is particularly effective.

The metal layer 28 is formed on the contact layer 20, as shown in FIG. 2C. The metal layer 28 is provided to reduce the resistance of the Schottky electrode 30. When the contact layer 20 and the metal layer 28 are made of different materials, electromotive force is generated at an interface between the contact layer 20 and the metal layer 28 due to a difference in electron affinity. This difference may facilitate the reaction of formula (3) and chipping of the tungsten silicide layer. Thus, it is particularly effective to contain oxygen in tungsten silicide. Particularly, the metal layer 28 made of gold may help to generate an electromotive force at the interface between the contact layer 20 and the metal layer 28. Thus, the structure of containing oxygen in tungsten silicide is particularly effective.

As shown in FIG. 3B, the source electrode 32 and the drain electrode 34, which are ohmic electrode, are in contact with the semiconductor substrate 10 when the silicon oxide film 14 is removed. In this case, electrons may be supplied from the ohmic electrodes and may help the reaction of formula (3). Thus, the tungsten silicide layer may be more liable to be chipped. Thus, it is more effective to contain oxygen in tungsten silicide.

Second Embodiment

Figure 8A:
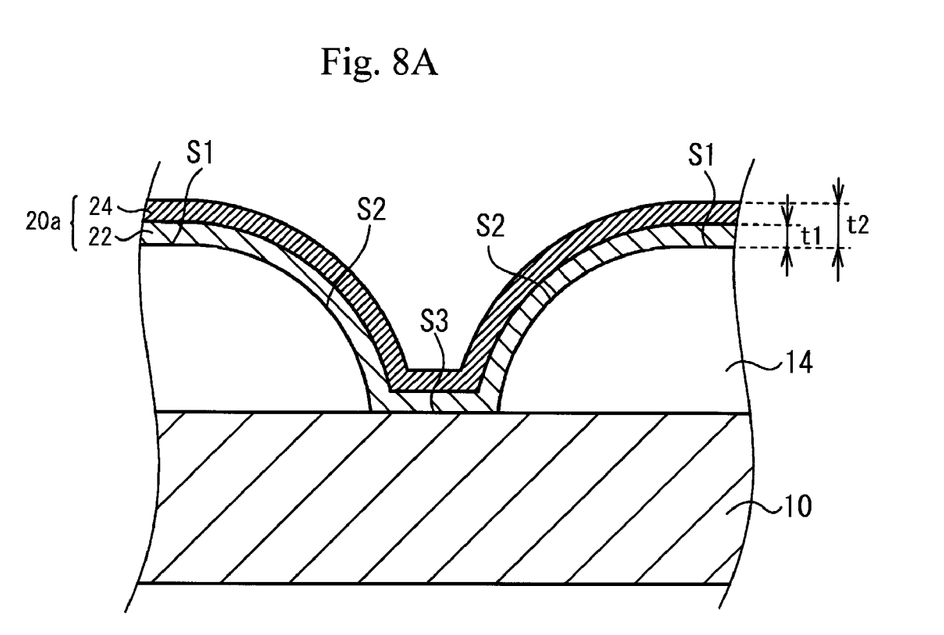
FIG. 8A is a cross-sectional view of a step of a process for fabricating an FET in accordance with a second embodiment.
Figure 8B:
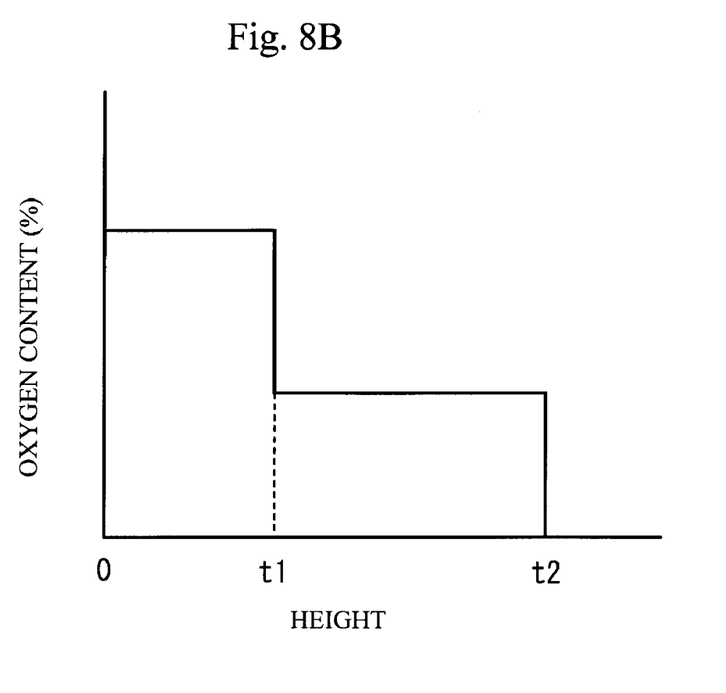
FIG. 8B is a graph of an oxygen content with respect to the height of a contact layer of the FET.

A second embodiment changes the content of oxygen in the contact layer. FIG. 8A corresponds to the production step shown in FIG. 2B and shows a step of forming the contact layer 20 of tungsten silicide. A first contact layer 22 having a thickness t1 of 0.03 µm is grown on the silicon oxide film 14 and in the opening 16. A second contact layer 24 having a thickness of 0.12 µm is grown on the first contact layer 22. The conditions for growth of the first and second contact layers 22 and 24 are the same as those for samples B and A described with reference to FIG. 4. The first and second contact layers 22 and 24 form a contact layer 20a. As shown in FIG. 8B, the oxygen content in the first contact layer 22 is comparatively high, and that in the second contact layer 24 is comparatively low.

In the second embodiment, the first contact layer 22 made of tungsten silicide containing oxygen is provided in a region that the silicon oxide film 14 contacts (this region contacts an upper surface S1 of the silicon oxide film 14 and a side surface S2 of the opening 16), and the second contact layer 24 made of tungsten silicide containing oxygen having a lower content than that of the first contact layer 22 is provided on the first contact layer 22. The tungsten silicide layer grown under the condition for sample B has a comparatively large oxygen content and has great effects of restraining chipping of the tungsten silicide layer. However, the above tungsten silicide layer may contain a large amount of an impurity such as argon, and has a high resistivity. With the above in mind, in FIG. 3B, the first contact layer 22 having a comparative large content of oxygen is arranged in the region that contacts the silicon oxide film 14 and the semiconductor substrate exposed to an aqueous solution that primarily contains hydrofluoric acid, and the second contact layer 24 having a comparatively small contact of oxygen is arranged in a region further than the above region from the semiconductor substrate 10 and the silicon oxide film 14. With the above structure, it is possible to restrain increase in the resistance of the contact layer 20a and restrain chipping of the tungsten silicide layer.

In order to restrain the tungsten silicide layer from being chipped, it is preferable that the oxygen content of the first contact layer 22 is equal to or greater than 2.6%. The first contact layer 22 is arranged in the region that the silicon oxide film 14 contacts. In order to more effectively restrain the tungsten silicide layer from being chipped, the first contact layer 22 is arranged in the entire region that contacts the silicon oxide film 14. The first contact layer 22 may be arranged in a region that contacts the semiconductor substrate 10. In order to restrain the tungsten silicide layer from being chipped, the first contact layer 22 is preferably 0.03 µm thick or more.

Preferably, the second contact layer 24 is formed by sputtering with a higher sputtering pressure than that used for forming the first contact layer 22. Thus, the oxygen content of the first contact layer 22 can be made greater than that of the second contact layer 24, as shown in FIG. 4.

Figure 9A:
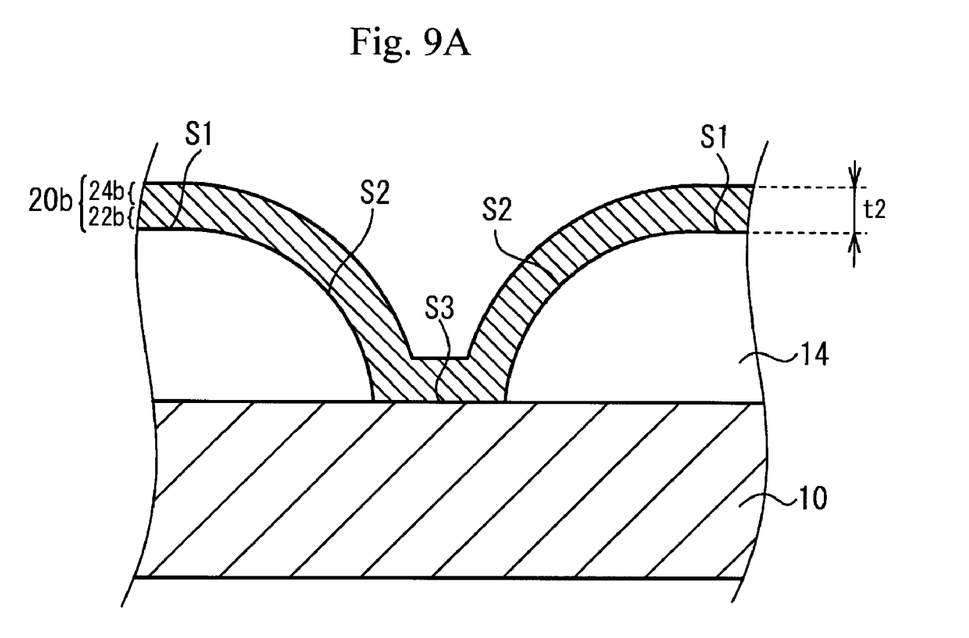
FIG. 9A is a cross-sectional view of a step of a process for fabricating an FET in accordance with the second embodiment.

FIG. 9A is a cross-sectional view of the semiconductor substrate 10 observed in a process for fabricating an FET in accordance with a variation of the second embodiment. The sputtering pressure is gradually increased in the process of forming the contact layer 20b. The oxygen content gradually decreases as the film growing process goes on, as shown in FIG. 4. Thus, as shown in FIG. 9B, the oxygen content as a function of the height of the contact layer 20b decreases evenly.

As in the case of the variation of the second embodiment, the content of oxygen in the contact layer 20b is set so as to gradually decrease as the position of interest is further away from the region that contacts the silicon oxide film 14 and the semiconductor substrate 10. That is, the oxygen content that decreases continuously may be realized by the process for forming a first contact layer 22b and a second contact layer 24b. The oxygen content of a contact layer composed of the first and second contact layers 22b and 24b continuously decreases from the lower side to the upper side of the overhang portion 31. Thus, like the second embodiment, the present variation is capable of restraining the resistance of the contact layer 20b from increasing and restraining the tungsten silicide layer from being chipped. In FIG. 9A, the contact layer 20b is illustrated so as to be composed of the two separate contact layers 22b and 24b for the sake of simplicity. It is to be noted that, in actually, as shown in FIG. 9B, the oxygen content changes continuously. However, the present variation allows a discontinuity in the oxygen content at the interface between the first contact layer 22b and the second contact layer 24b.

Figure 9B:
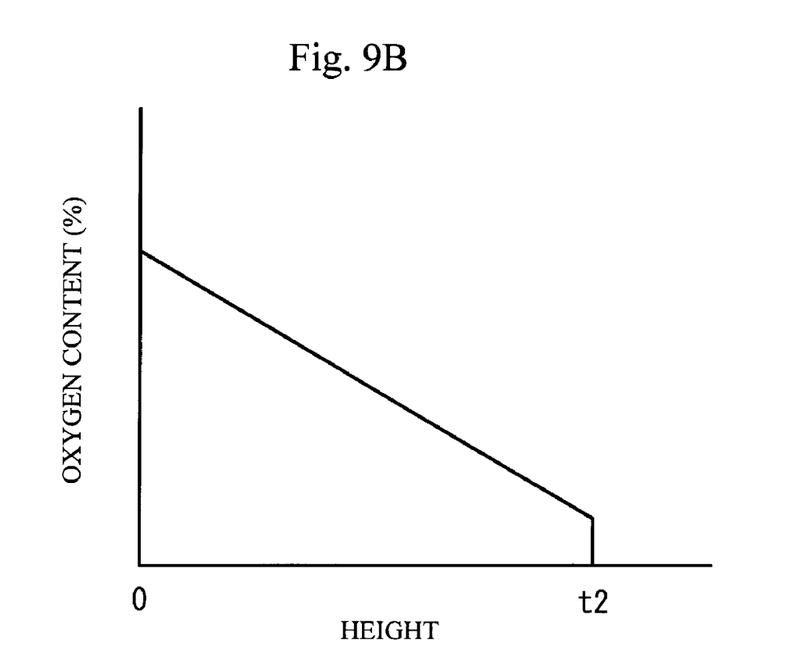
FIG. 9B is a graph of an oxygen content with respect to the height of a contact layer of the FET.

In the second embodiment and its variation, when the contact layer 20a or 20b is formed, the sputtering pressure used to form the region that contacts the silicon oxide film 14 and the semiconductor substrate 10 (the above region has a height of zero or close to zero in FIGS. 8B and 9B) is made lower than the sputtering pressure used to form the region away from the region that contacts the silicon oxide film 14 and the semiconductor substrate 10 (the above region has a height t2 in FIGS. 8B and 9B). It is thus possible to obtain a larger oxygen content in the region that contacts the silicon oxide film 14 and the semiconductor substrate 10 than that in the region away from the silicon oxide film 14 and the semiconductor substrate 10. The sputtering power may be raised instead of lowering the sputtering pressure. Oxygen gas may be added to the sputtering gas instead of lowering the sputtering pressure and the concentration of oxygen gas may be increased.

Third Embodiment

Figure 10:
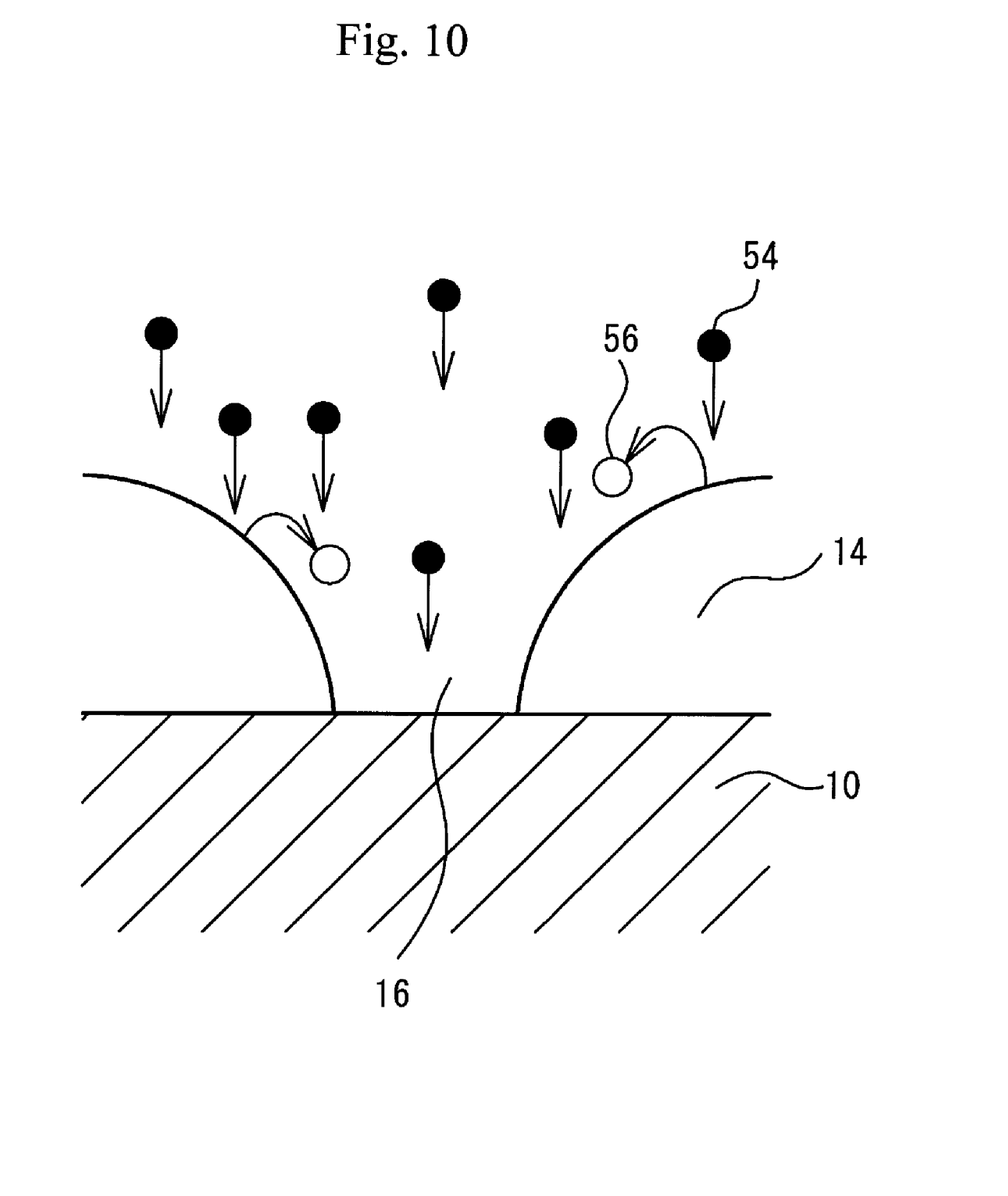
FIG. 10 schematically shows sputtering of tungsten silicide in a third embodiment.

A third embodiment has an arrangement in which silicon oxide in the silicon oxide film 14 is taken in the contact layer 20. FIG. 10 schematically illustrates a step in which the contact layer of tungsten silicide is being grown. When molecules 54 of WSi hit the silicon oxide film 14, if the WSi molecules 54 have a large kinetic energy, $SiO_2$ molecules 56 are sputtered.

Figure 11:
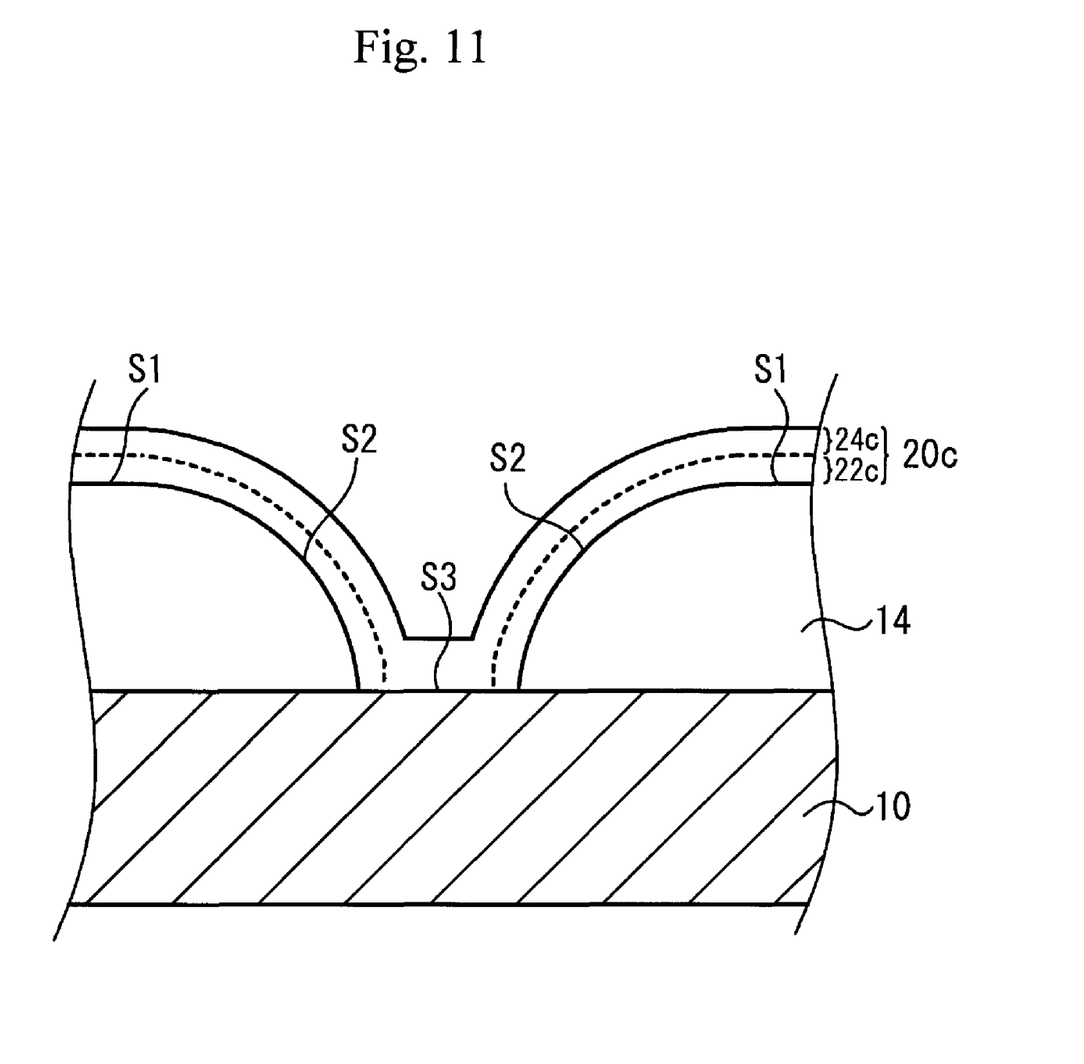
FIG. 11 is a cross-sectional view of a step of a process for fabricating the FET in accordance with the third embodiment.

FIG. 11 is a cross-sectional view of the semiconductor substrate 10 observed in a process for fabricating an FET in accordance with the third embodiment. The $SiO_2$ molecules 56 are sputtered from the silicon oxide film 14. Thus, a contact layer 20c close to the interface with the silicon oxide film 14 includes a first contact layer 22c that is a region containing a large mount of oxygen. That is, the surface of the silicon oxide film 14 is sputtered and the resultant oxygen (for example, molecules of silicon oxide) included in the silicon oxide film 14 are taken in the region that contacts the silicon oxide film 14 (this region contacts the upper surface S1 of the silicon oxide film 14 and the side surface S2 of the opening 16), so that the first contact layer 22c containing oxygen can be formed in the above region. In FIG. 3C, the region of the contact layer 20 exposed to the aqueous solution containing hydrofluoric acid used for removing the silicon oxide film 14 contacts the silicon oxide film 14. Thus, the third embodiment is capable of restraining the tungsten silicide layer from being chipped. Further, silicon oxide of the silicon oxide film 14 is taken in the contact layer 20. It is thus possible to stably take oxygen in the contact layer 20, as compared to the first embodiment in which residual oxygen in the chamber of the sputtering apparatus is used. Furthermore, the present embodiment does not need new sputtering gas such as oxygen gas, and reduces the production cost.

In FIG. 10, the tungsten silicide molecules 54 may have an increased kinetic energy when sputtered from the target with higher energy. However, referring to FIG. 11, after the first contact layer 22c in which the silicon oxide molecules 56 are taken is formed, the silicon oxide film 14 is already covered with the tungsten silicide film, and a second contact layer 24c formed on the first contact layer 22c does not have an increased oxygen content even when the sputtering power is raised. There is a further problem. When the sputtering power is high, argon of the sputtering gas is taken in the contact layer 20c and increases the resistance of the contact layer 20c. Thus, when the contact layer 20c is formed, the sputtering power used to form the region that contacts the silicon oxide film 14 is preferably made greater than the sputtering power used to form the region away from the silicon oxide film 14. The sputtering pressure may be lowered instead of raising the sputtering power.

When the contact layer 20c is formed with a high sputtering power, the semiconductor substrate 10 may be damaged.

Thus, it is preferable that annealing is performed after the first contact layer 22c is formed in order to restore the damaged surface of the semiconductor substrate 10 in the bottom of the opening 16. The annealing may be performed at 500° C. for 30 minutes. The semiconductor substrate 10 may be annealed before or after forming the second contact layer 24c.

The FETs of the first and second embodiments have oxygen that has reacted with silicon in the side and bottom surfaces of the contact layer 20 (which contact the silicon oxide film 14 and the semiconductor substrate 10, respectively). In contrast, the FET of the third embodiment has a large amount of oxygen that has reacted with silicon in the side surface of the contact layer 20 (which contacts the silicon oxide film 14), but does not have a large amount of oxygen that has reacted with silicon in the bottom surface. The region of the contact layer 20 exposed to the solution containing hydrofluoric acid for removing the silicon oxide film 14 is the side surface of the contact layer 20. Thus, at least the side surface of the contact layer 20 is required to contain oxygen that has reacted with silicon.

As described above, in FIG. 2B, the tungsten silicide layer can be restrained from being chipped by forming the contact layer 20 so that a region that contacts the silicon oxide film 14 and the semiconductor substrate 10 contains oxygen.

The first through third embodiments are the exemplary FETs using the GaAs substrate. The present invention includes semiconductor devices having Schottky electrodes other than the FETs. The first through third embodiments use the semiconductor layer that has the layer epitaxially grown on the GaAs substrate. The present invention is not limited to the above semiconductor layer but may be a GaAs substrate, an AlGa substrate or an Si substrate. That is, the surface of the semiconductor layer is the surfaces of these substrates. The solution that contains hydrofluoric acid is not limited to the buffered hydrofluoric acid that contains hydrofluoric acid and ammonium fluoride, but may be an aqueous solution of hydrofluoric acid. The insulating film is not limited to the silicon oxide film 14 but may be an insulating film that contains silicon oxide removable by a solution containing hydrofluoric acid. For example, the insulating film may be silicon oxy-nitride (SiON).

The present invention is not limited to the specifically disclosed embodiments, but may include other embodiments and variations without departing from the scope of the present invention.

The present application is based on Japanese Patent Application No. 2007-028603 filed on Feb. 7, 2007, the entire disclosure of which is hereby incorporated by reference.

What is claimed is:

1. A method for fabricating a semiconductor device comprising:
   forming an insulating film provided on a semiconductor layer, the insulating film having an opening via which a surface of the semiconductor layer is exposed and including silicon oxide;
   forming a Schottky electrode on the insulating film and in the opening, the Schottky electrode having an overhang portion and having a first contact layer that is provided in a region contacting the insulating film, is made of tungsten silicide and contains oxygen, and a second contact layer that is provided on the first contact layer, is made of tungsten silicide and contains a smaller content of oxygen than that of the first contact layer; and
   removing the insulating film by a solution including hydrofluoric acid.

2. The method as claimed in claim 1, wherein forming the second contact layer includes sputtering tungsten silicide with a sputtering pressure higher than that at which the first contact layer is formed by sputtering.

3. The method as claimed in claim 1, wherein the first contact layer has a thickness equal to or greater than 0.03 μm.

4. The method as claimed in claim 1, wherein the first contact layer has an oxygen content of 2.6% or more.

5. The method as claimed in claim 1, wherein forming the first contact layer includes sputtering a surface of the insulating film to take oxygen in the insulating film in the first contact layer.

6. The method as claimed in claim 1, wherein forming the Schottky electrode includes annealing the first contact layer after forming the first contact layer.

7. The method as claimed in claim 1, wherein forming the Schottky electrode forms the first and second contact layers so that the oxygen contact continuously decreases from the first contact layer to the second contact layer.

8. A method for fabricating a semiconductor device comprising:
  forming an insulating film provided on a semiconductor layer, the insulating film having an opening via which a surface of the semiconductor layer is exposed and including silicon oxide;
  forming a Schottky electrode on the insulating film and in the opening, the Schottky electrode having an overhang portion and having a contact layer that is provided in a region contacting the insulating film and is composed of a portion made of tungsten silicide having an oxygen content of 2.6% or more; and
  removing the insulating film by a solution including hydrofluoric acid.

* * * * *